United States Patent
Yamagata et al.

(10) Patent No.: US 6,737,168 B1
(45) Date of Patent: May 18, 2004

(54) COMPOSITE MATERIAL AND SEMICONDUCTOR DEVICE USING THE SAME

(75) Inventors: Shinichi Yamagata, Itami (JP); Kazuya Kamitake, Itami (JP); Yugaku Abe, Itami (JP); Akira Fukui, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 197 days.

(21) Appl. No.: 09/762,931
(22) PCT Filed: Jun. 8, 2000
(86) PCT No.: PCT/JP00/03743
§ 371 (c)(1), (2), (4) Date: Feb. 14, 2001
(87) PCT Pub. No.: WO00/76940
PCT Pub. Date: Dec. 21, 2000

(30) Foreign Application Priority Data

Jun. 14, 1999 (JP) .............................. 11-166214

(51) Int. Cl.[7] ................................ B32B 9/04
(52) U.S. Cl. ................. 428/446; 428/304.4; 428/307.3; 428/307.7; 257/914
(58) Field of Search ............. 428/304.4, 307.3, 428/307.7, 307.8, 312.8; 257/914

(56) References Cited

U.S. PATENT DOCUMENTS 6,110,577 A * 8/2000 Ishikawa et al.

FOREIGN PATENT DOCUMENTS

| EP | 0 859 410 | 8/1998 |
|----|-----------|--------|
| JP | 1-115888 | 5/1989 |
| JP | 1-501489 | 5/1989 |
| JP | 2-243729 | 9/1990 |
| JP | 5-32458 | 2/1993 |
| JP | 8-222660 | 8/1996 |
| JP | 8-330465 | 12/1996 |
| JP | 9-157773 | 6/1997 |
| JP | 10-194876 | 7/1998 |
| JP | 1102379 | * 2/1999 |

OTHER PUBLICATIONS http://home.pacbell.net/juands/chemreadings.htm.*
www.jimloy.com/physics/periodic.htm.*
Chemistry–The Study of Matter and Its Changes by J. Brady and J. Holum, CP 1993, pp. 57–59.*
"Thermal Diffusivity of Silicon–Silicon Carbide Composites", E. Scafe et al., Advanced Structural Inorganic Composites, (1991), pp. 421–427.

* cited by examiner

Primary Examiner—Merrick Dixon
(74) Attorney, Agent, or Firm—McDermott, Will & Emery

(57) ABSTRACT

A composite material that consists mainly of ceramic and semi-metal, that is high in thermal conductivity, that is light in weight, and that has high compatibility in coefficient of thermal expansion (CTE) with a semiconductor element and another member comprising ceramic; a member comprising this composite material; and a semiconductor device comprising the member. The composite material has a structure in which the interstices of a three-dimensional network structure comprising ceramic are filled with a semi-metal-containing constituent produced by deposition after melting, has a CTE of 6 ppm/° C. or less, and has a thermal conductivity of 150 W/m·K or more. The semiconductor device comprises the composite material. The composite material can be obtained by filling the pores of a porous body consisting mainly of ceramic with a semi-metal-containing constituent.

12 Claims, 5 Drawing Sheets

COMPOSITE MATERIAL AND SEMICONDUCTOR DEVICE USING THE SAME

TECHNICAL FIELD

The present invention relates to a composite material for various devices and apparatuses, especially a composite material having high thermal conductivity and a low coefficient of thermal expansion (hereinafter called CTE), which material is useful for a heat-dissipating substrate of semiconductor devices.

BACKGROUND ART

Recently, market demands for faster computation and higher integration of semiconductor devices (various devices incorporating semiconductor elements; the same shall apply hereinafter) have been rapidly increasing. At the same time, a heat-dissipating substrate for mounting a semiconductor element (hereinafter also called simply a heat-dissipating substrate) of a semiconductor device has been required to further increase its thermal conductivity in order to dissipate the heat generated by the element more effectively. The substrate has also been required to have a CTE much closer to that of the semiconductor element and of the device's other members (the peripheral members) adjacent to the substrate in order to further decrease the thermal strain between the substrate and the semiconductor element and between the substrate and the peripheral members. Specifically, Si and GaAs, which are commonly used as a semiconductor element, have a CTE of $4.2 \times 10^{-6}/°$ C. and $6.5 \times 10^{-6}/°$ C., respectively. An alumina ceramic, which is commonly used as an enclosing material of semiconductor devices, has a CTE of about $6.5 \times 10^{-6}/°$ C. Consequently, it is desirable that a heat-dissipating substrate have a CTE close to these values.

As electronic devices expand their field of application significantly in recent years, semiconductor devices are further diversifying their application fields and performances. In particular, market demands are increasing for semiconductor power devices, such as high-output ac converters and frequency changers. In these devices, a semiconductor element generates heat no less than several to several-dozen times that of a semiconductor memory or LSI; such a semiconductor element usually generates tens of watts. Therefore, heat-dissipating substrates for these devices are required to have significantly increased thermal conductivity and a CTE much closer to that of the peripheral members. To meet this requirement, semiconductor power devices have the fundamental structure described below. First, an Si semiconductor element is placed on a first heat-dissipating substrate made of an aluminum nitride (hereinafter also called simply AlN) ceramic, which is excellent in electrical insulation quality and thermal conductivity. Second, a second heat-dissipating substrate made of a highly heat-conductive metal, such as copper or aluminum, is placed underneath the first heat-dissipating substrate. Finally, a radiator that can be cooled by air or water is placed underneath the second heat-dissipating substrate. The generated heat is dissipated promptly to the outside by such a structure. Consequently, the second heat-dissipating substrate is required to conduct the heat received from the first heat-dissipating substrate promptly to the radiator underneath. This means that it is essential for the second heat-dissipating substrate to have not only high thermal conductivity but also a CTE close to that of the first heat-dissipating substrate. Specifically, the second heat-dissipating substrate is required to have a CTE as small as $6 \times 10^{-6}/°$ C. or less.

Such a heat-dissipating substrate has been made of a composite alloy consisting mainly of W or Mo, for example. The drawback of these substrates, however, is that they are heavyweight as well as high cost owing to the costly material. To resolve this problem, various aluminum (hereinafter also called simply Al) composite alloys have been attracting attention in recent years as material that is light in weight as well as low in cost. In particular, Al—SiC-based composite materials, consisting mainly of Al and silicon carbide (herein-after also called simply SiC), are comparatively low in material cost, light in weight, and high in thermal conductivity. A pure-Al single body and a pure-SiC single body, which are usually available in the market, have a density of about 2.7 g/cm$^3$ and about 3.2 g/cm$^3$, respectively, and a thermal conductivity of about 240 W/m·K and about 200 to about 300 W/m·K, respectively. A pure-SiC single body and a pure-Al single body have a CTE of about $4.2 \times 10^{-6}/°$ C. and about $24 \times 10^{-6}/°$ C., respectively. The adjustment of the constituting ratio of SiC and Al produces a wide CTE range. They are, therefore, advantageous in this respect.

As a result, various composite materials comprising Al and ceramic have been developed with particular focus on an Al—SiC-based composition. For example, the published Japanese patent applications Tokukaihei 8-222660, Tokukaihei 8-330465, Tokukaihei 1-501489, and Tokukaihei 2-243729 disclose inventions in which composite materials are produced by the infiltration method or casting method. Another published Japanese patent application, Tokukaihei 9-157773, discloses an invention in which a composite material is produced by hot-pressing a formed body of mixed powders. The U.S. Pat. No. 5,006,417 discloses a composite material in which Si is added to the Al—SiC-based composition. The composite material has a metal matrix in which a reinforcement material insoluble in the metal matrix is distributed. For example, an Al—SiC—Si-based composite material is reinforced by SiC and Si. The object of that invention is to provide a lightweight member to be sandwiched between a plastic-glass-based circuit board having a large CTE and a ceramic member having a small CTE to be mounted on the board. The lightweight member is required to have an intermediate CTE between the two CTEs. The composite material of that invention has low density, small CTE, good thermal conductivity, good dimensional stability, and good formability. A typical composite material stated in that invention comprises a 40 to 60 vol % Al matrix in which 10 to 40 vol % Si, which is a semi-metal, and 10 to 50 vol % SiC are distributed. However, the preferable embodiment (the sample shown in Table 1 of that invention), containing Al with an amount of 45 to 55 vol % (the wt % is much the same), has a CTE of 8 to $9 \times 10^{-6}/°$ C. or so. Therefore it cannot be said that the composite material has a CTE close to that of ceramic, which has a CTE of 3 to $6 \times 10^{-6}/°$ C. or so. The composite material is obtained by solidifying a mixed powder comprising the foregoing constituents at a temperature higher than the melting point of the metal constituent. According to FIG. 2 of that invention, it can be conjectured that an Al—SiC—Si-based material produces a composite material having a CTE of $6 \times 10^{-6}/°$ C. or less when the amount of SiC or Si is about 70 vol % or more. That invention states that the Al—SiC—Si-based composition can produce a composite material having a thermal conductivity up to about 120 W/m·K if a proper composition is selected, although the proper composition is not stated. Other researchers and engineers have been studying materials obtained by the liquid-phase sintering method. A composite material in which Al is replaced by Cu is also advantageous from the foregoing stand-point. In the present invention, the above-described materials are hereinafter called the first-group composite materials.

As described above, the first-group composite materials have high thermal conductivity. However, because Al and Cu have a large CTE, a composite material having a CTE as low as about $6 \times 10^{-6}/°$ C. cannot be obtained unless the amount of SiC, which has a small CTE, is increased. The increase in the amount of SiC, which has high hardness, makes it difficult to form the powder and to sinter the formed body. In addition, composite materials have been required to have a complicated shape, such as a fin shape, in recent years. These types consume much time and effort for the finishing process.

On the other hand, composite materials comprising silicon (Si), which has a small CTE and is lightweight in comparison with the first-group composite materials, and silicon carbide (SiC) have been developed. For example, the published Japanese patent application Tokukaihei 5-32458 discloses an Si—SiC-based composite material for a member to support the raw material for the formation of an Si or other semiconductor element when the raw material is heat-treated in the manufacturing process. The composite material is obtained by infiltrating molten Si into a porous body that is produced by sintering a highly pure SiC powder, having an iron content of 5 ppm or less, at a temperature between 1,500 and 2,300° C. Another Si—SiC-based composite material that contains up to about 70 vol % SiC is reported in the Advanced Structural Inorganic Composites (1991), pp. 421 to 427. The composite material is obtained by reaction-sintering a formed body comprising a mixture of highly pure SiC powders and highly pure carbon (C) powders. Table II in the literature shows a composite material having a thermal conductivity as high as 186.6 W/m·K. However, no report has been found that demonstrates the example that these composite materials are applied to a heat-dissipating substrate or other members of semiconductor devices. In the present invention, these composite materials are hereinafter called the second-group composite materials.

An object of the present invention is to solve the foregoing problems that the first-group composite materials have and to improve the second-group composite materials so that both composite materials can be used effectively as members of semiconductor devices.

DISCLOSURE OF THE INVENTION

The composite material of the present invention (a) has a structure in which the interstices of a three-dimensional network structure comprising ceramic (a first constituent) are filled with a semi-metal-containing constituent (a second constituent) produced by deposition after melting, (b) has a CTE of $6 \times 10^{-6}/°$ C. or less, and (c) has a thermal conductivity of 150 W/m·K or more. The types of the composite material of the present invention include a composite material in which the ceramic contains silicon carbide (SiC) and a composite material in which the semi-metal is silicon (Si). The present invention encompasses (a) semiconductor-device members comprising the foregoing composite materials and (b) semiconductor devices comprising the above-mentioned members.

EXPLANATION OF THE SIGNS

Figure 1:
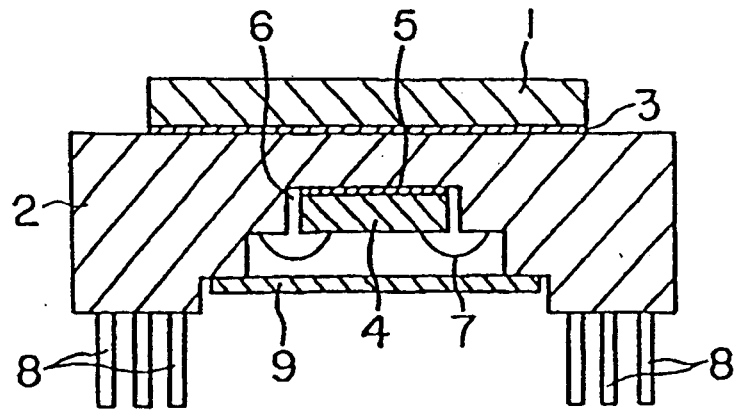
FIG. 1 is a view showing an example of the semiconductor device of the present invention.
Figure 2:
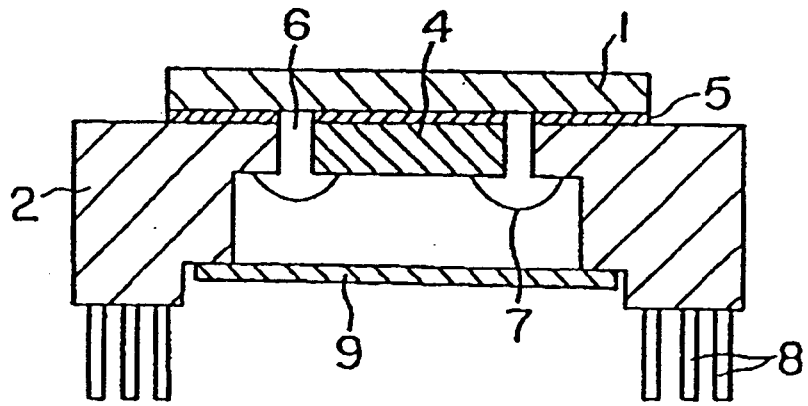
FIG. 2 is a view showing another example of the semiconductor device of the present invention.
Figure 3:
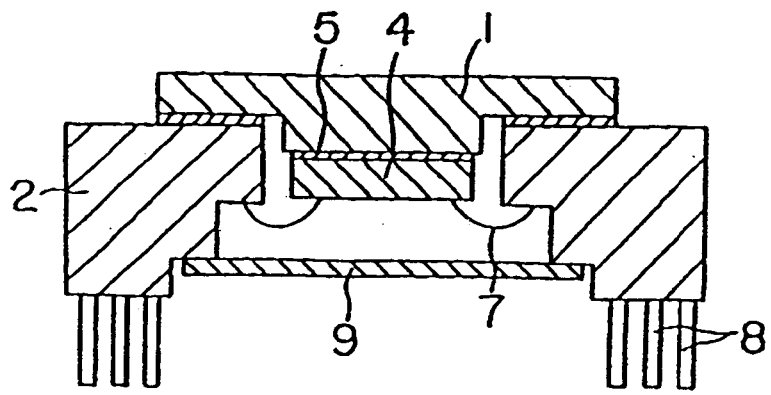
FIG. 3 is a view showing yet another example of the semiconductor device of the present invention.
Figure 4:
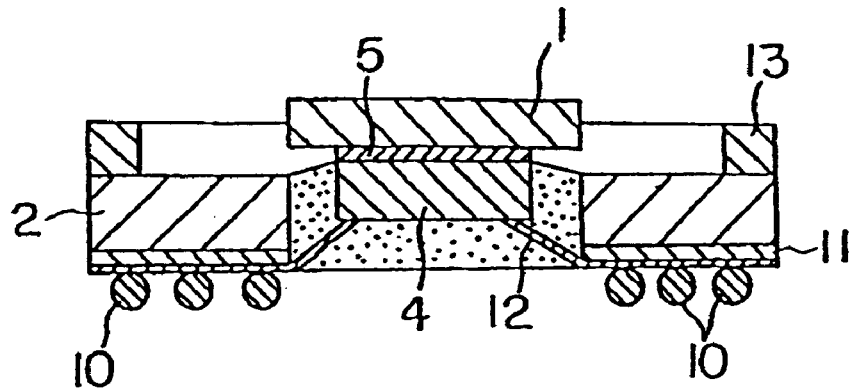
FIG. 4 is a view showing yet another example of the semiconductor device of the present invention.
Figure 5:
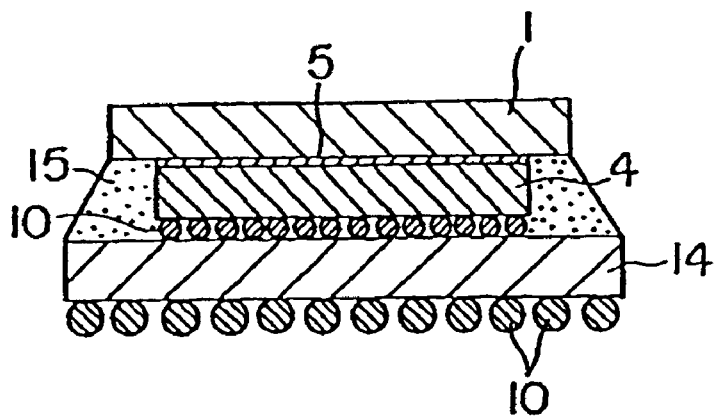
FIG. 5 is a view showing yet another example of the semiconductor device of the present invention.
Figure 6:
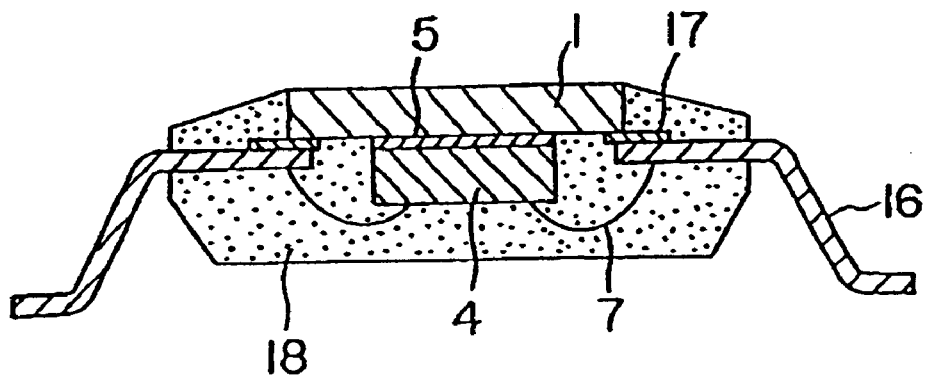
FIG. 6 is a view showing yet another example of the semiconductor device of the present invention.

1: heat-dissipating substrate; 2: package body; 3: highly heat-conductive plastic layer; 4: semiconductor element; 5: bonding layer; 6: die-attaching portion; 7: bonding wire; 8: metallic lead pin; 9: cap; 10: solder ball; 11: polyimide tape; 12: copper-foil circuit; 13: support ring; 14: wiring substrate; 15: resin; 16: lead flame; 17: insulating film; 18: mold resin; 19: aluminum fin; 20: silicone resin; 21: radiator; 22: first substrate; 23: case; 24: lid; and 25: hole.

EMBODIMENT 1

The composite material of the present invention comprises a first constituent and a second constituent. The first constituent, comprising ceramic, forms a three-dimensional network structure. The second constituent, containing a semi-metal, fills the interstices of the network. The second constituent may contain, in addition to the semi-metal, a compound formed by metal and the first constituent and an alloy or a compound formed by metal, semi-metal, and the first constituent. In this case, at least one constituent contained in the second constituent exists in the form of deposition after the melting. The composite material is obtained through the following process, for example: First, a porous body consisting mainly of ceramic particles as the first constituent is formed. Second, the porous body is placed so as to be in contact with the second constituent. Third, the porous body and the second constituent are heated to a temperature not lower than the melting point of at least one constituent in the second constituent to fill the pores of the ceramic porous body with the molten liquid of the second constituent.

In the ceramic three-dimensional network structure of the present invention, ceramic particles are partially in intimate contact with one another. Nevertheless, constituents other than the ceramic, which is the principal constituent, may exist at the intimate contact portion between the ceramic particles. For example, in an SiC—Si-based composition, Si exists at the intimate contact portion between SiC particles. Smaller ceramic particles in the composite material may combine with larger particles at the stage of the below-described pre-sintering before the infiltration or at the stage of infiltration. As a result, in an SiC—Si-based composition, for example, the final average diameter of SiC increases. The interstices of the network structure are filled with the second constituent. The semi-metal included in the second constituent, the coexisting metal, or both exist in the form of deposition after melting.

An example of the first constituent included in the composite material of the present invention is a ceramic consisting mainly of a material such as silicon carbide (SiC), silicon nitride ($Si_3N_4$), aluminum nitride (AlN), and boron nitride (BN). The ceramic is required to have a CTE of $5 \times 10^{-6}/°$ C. or less and relatively high thermal conductivity. The semi-metal is selected from the elements included in the 3b group or 4b group (they are also called semi-metals) in the Periodic Table. Examples of the selected semi-metals are silicon (Si), germanium (Ge), carbon (C; diamond or graphite), boron (B), and their mixture. The semi-metal is required to have a CTE of $8.5 \times 10^{-6}/°$ C. or less and relatively high thermal conductivity. An example of constituents other than the foregoing semi-metal in the second constituent is a metal material consisting mainly of a metal such as aluminum (Al), copper (Cu), silver (Ag), gold (Au), manganese (Mn), tungsten (W), and molybdenum (Mo). The metal material is required to have a thermal conductivity of 140 W/m·K or more.

In the composite material of the present invention, it is desirable that the ceramic particles forming the three-dimensional network structure have an average particle diameter of 30 µm or more. If the average particle diameter is less than 30 µm, the interface between the particles increases the heat scattering, thereby decreasing the thermal conductivity considerably.

It is desirable that the first constituent of the present invention include silicon carbide (SiC), which is particularly low in cost and high in thermal conductivity among the foregoing ceramics. SiC has a density of 3.2 g/cm³ (this means light weight) and a thermal conductivity of 200 to 300 W/m·K or so, which is excellent among ceramics. SiC has a CTE of about $4.2 \times 10^{-6}/°$ C., which is much the same as that of an Si semiconductor element and of an AlN ceramic substrate that directly mounts the element.

When the ceramic constituent contains SiC as the principal constituent, it is desirable that the amount of the SiC in the composite material be 50 wt % or more. This amount usually produces a composite material having a thermal conductivity as high as 200 W/m·K or more. If the amount is less than 50 wt %, it becomes difficult to maintain the form of the porous body before the infiltration. It is desirable that the amount of the SiC be 90 wt % or less. If the amount is more than 90 wt %, the porosity decreases, making it difficult for the molten substance in the second constituent to perform the infiltration.

It is desirable that the semi-metal constituent of the composite material of the present invention be silicon. Among semi-metals, silicon is relatively high in thermal conductivity and has a small CTE.

In the case of an Si—SiC-based composite material, whose second constituent is the semi-metal Si, there is practically no difference in CTE between the composite material and an Si semiconductor element and between the composite material and a ceramic substrate. Consequently, the bonding between these components seldom produces deformation or damage caused by thermal stresses. In addition, regardless of the constituting ratio of Si to SiC, a composite material having a similar CTE usually as small as $4 \times 10^{-6}/°$ C. or so can be obtained. However, Si has a thermal conductivity as low as 145 W/m·K or so. Therefore, it is difficult to obtain a composite material having an extremely high thermal conductivity such as over 300 W/m·K, which can be obtained with an Al—SiC-based composition or a Cu—SiC-based composition. Nonetheless, an Si—SiC-based composite material having a thermal conductivity of 150 W/m·K or more is usually available.

The reduction in the amount of impurities in the material to 1 wt % or less can produce a composite material having higher thermal conductivity. Here the main constituents are SiC and Si in the case of an SiC—Si-based composition and SiC, Si, and Al in the case of an SiC—Si—Al-based composition, for example; the impurities are oxygen and transition-metal elements (also called cation impurities) other than the main constituents. Of these impurities, it is particularly desirable that the amount of the iron-group elements (Fe, Ni, and Co) in the ceramic particles be reduced to 100 ppm or less. Thus, the reduction in the amount of impurities in the constituents can produce a composite material having an extremely high thermal conductivity exceeding 200 W/m·K.

The selection of Si as the second constituent and the concurrent selection of $Si_3N_4$, AlN, or BN in place of SiC of the first constituent can also produce a composite material having properties similar to those of the SiC—Si-based composite material. However, $Si_3N_4$ has a lower thermal conductivity (usually 100 to 150 W/m·K or so) than SiC; AlN has a lower mechanical strength than SiC (usually 50 to 60% of that of SiC); and BN is high in material cost. Therefore, they are disadvantageous in comparison with SiC for the use intended by the present invention. Nevertheless, $Si_3N_4$ is superior in mechanical strength (usually its bending strength is 1.5 to 2 times that of SiC); AlN has high thermal conductivity and a small CTE; and the two also have excellent electrical-insulation properties. On the other hand, BN not only has high thermal conductivity (usually 500 W/m·K or more) but also has a small CTE (usually $4 \times 10^{-6}/°$ C. or so) and high mechanical strength (usually its bending strength is 1.5 to 2 times that of SiC). If these features are exploited, they can be useful materials for practical applications.

As previously described, the second constituent of the composite material of the present invention may contain, in addition to the semi-metal, a metal constituent, such as Al, Cu, Ag, Au, and Mn. When the semi-metal has a high melting point as with Si and B, the addition of these metal constituents can reduce the infiltration temperature of the second constituent, making the infiltration easier. However, excessive addition of these metal constituents increases the CTE of the composite material. Therefore, it is desirable that the amount of the addition be 20 wt % or less of the total weight of the composite material, more desirably 10 wt % or less, depending on the type and amount of the semi-metal used. On the other hand, W and Mo are highly heat conductive and have a low CTE. They are therefore desirable constituents as the second constituent; however, they have a high melting point. As a result, they are used as the second constituent together with the semi-metal and metal that have a lower melting point than W and Mo. They are also used as an additive that is previously added in small amounts to the powder of the first constituent as previously described.

The manufacturing method of the composite material of the present invention is described below. It is desirable to use as the material a ceramic powder, that has high purity (desirably 99.9% or more) and that has a crystal type superior in thermal conductivity. Impurities, such as transition metals (cation impurities), oxygen, and nitrogen, impede the heat conduction performed by phonons in the ceramic. For example, when SiC, $Si_3N_4$, AlN, or BN is used as the first constituent, it is desirable to select a material that contains only a small amount of transition metal impurities (also called cation impurities) such as iron-group elements (Fe, Ni, and Co), oxygen, and nitrogen, all of which reduce the thermal conductivity (it is desirable that each impurity has an amount as small as 100 ppm or less in weight). When SiC is used as the first constituent, it is desirable to select a crystal type, such as 6H type or 4H type, which is intrinsically superior in thermal conductivity. When $Si_3N_4$ is used as the first constituent, it is desirable to select a β crystal type, which is superior in thermal conductivity. It is not necessary to add sintering agents, which are used to obtain a closely packed structure in the case of ordinary ceramic sintered bodies. Sintering agents decrease the intrinsic thermal conductivity of ceramics. On the same ground as described above, it is desirable that the second constituent comprise a semi-metal and an added metal as required both of which contain few impurities, such as oxygen and nitrogen, which have high purity (usually 99.9% or more), and which have a crystal type superior in thermal conductivity.

The composite material of the present invention can be obtained through the following process: First, a porous body made of a powder of the first constituent is produced. Second, at least one constituent of the semi-metal and the metal both of which constitute the second constituent is melted. Finally, the molten second constituent fills the pores of the porous body. The powder of the first constituent may include, in addition to the ceramic powder, a portion of the constituent comprising the semi-metal and the metal both of which constitute the second constituent. This is known as the infiltration method by pre-mixing. This method is especially effective (a) in maintaining the shape of a formed body when the first constituent includes a small amount of ceramic constituent, increasing the volume of pores and (b) in increasing the wettability between the molten constituent and the ceramic particles when the second constituent performs infiltration. For example, when carbon (C) is pre-mixed into the first constituent comprising Si, the reaction at the interface between the two elements produces SiC, pre-cipitating the infiltration of Si. The pre-mixing of C increases the lubricity of the mixed powder, facilitating the formation. The first constituent, the second constituent, or both may contain, as required, a small amount of metal constituents that increase the wettability of the molten constituents at the time of infiltration (the amount is preferably less than 1 wt %, which usually has no detrimental effect on the thermal conductivity). When the ceramic powder of the first constituent comprises a mixture of two types of powders having a different grain size, the bulk density of the mixed powder becomes larger than that of a single powder, increasing the compressibility at the time of formation. In particular, when the average particle diameter and the amount expressed in weight of the powders to be mixed are adjusted in such a manner that the ratio of the larger average diameter to the smaller average diameter falls between 1:5 and 1:15 and the ratio of the weight of the powder having a larger average diameter to the weight of the powder having a smaller average diameter falls between 2:1 and 4:1, a formed body having a formation density of 60% or more can easily be obtained. Even in this case, the mixed ceramic powders preferably have an average particle diameter of 30 μm or more. If the average particle diameter is less than 30 μm, the interfaces between the particles increase the occurrence of heat scattering, thereby easily decreasing the thermal conductivity. This grain size adjustment may be carried out in the form of the material powder, the granules produced by adding an organic binder, or both.

The formation of the powder of the first constituent is carried out by a known forming method by using a suitable organic binder. The shape can be given relatively easily before the infiltration. For example, a metal mold can give a shape at the time of forming; grinding can also produce a shape at the stage of a porous body after the removal of the binder. The porous body's porosity, which determines the amount of the infiltration of the second constituent, can be varied within a considerably wide range by controlling the formation density and the amount of the binder. In the materials of the present invention, the ceramic porous body includes almost no sintering agents, and the second constituent has a melting point lower than the sintering-shrinkage temperature of the ceramic. Therefore, almost no shrinkage deformation occurs at the time of infiltration. Even a porous body having a large size or a complicated shape is only modestly susceptible to deformation, enabling a net-shape infiltrated body to be easily obtained. In the sintering method, where the first constituent and the second constituent are mixed before sintering, shrinkage deformation can occur easily at the time of sintering. The infiltration method of the present invention is distinctly advantageous from the sintering method with respect to the above-described point. In addition, the inclusion of a semi-metal improves the machinability significantly even after the infiltration in comparison with the first-group composite materials described earlier.

Figure 9:
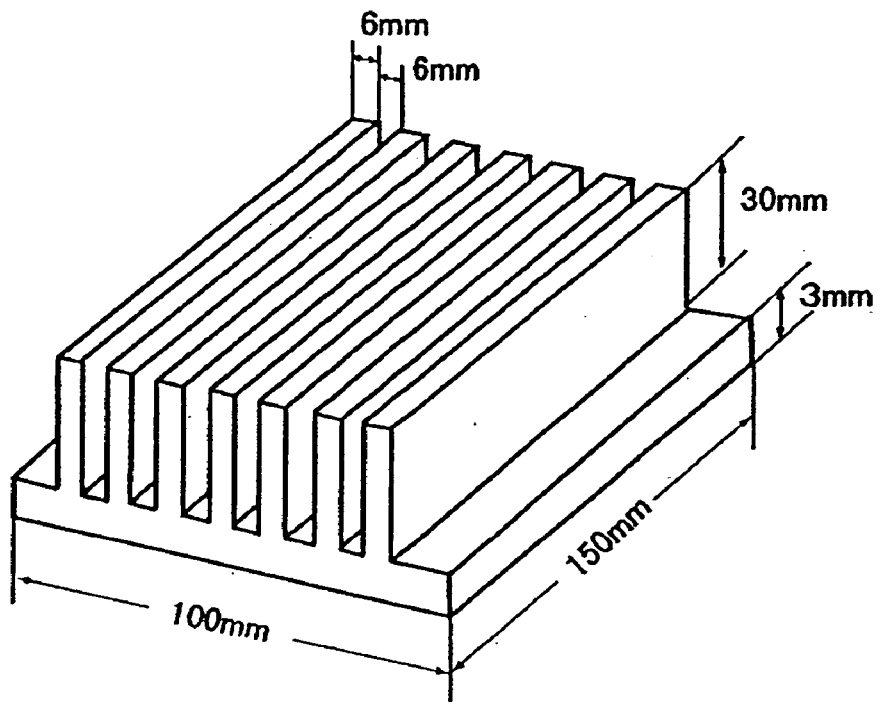
FIG. 9 is a view illustrating a radiator used in the semiconductor device of an embodiment of the present invention.
Figure 11:
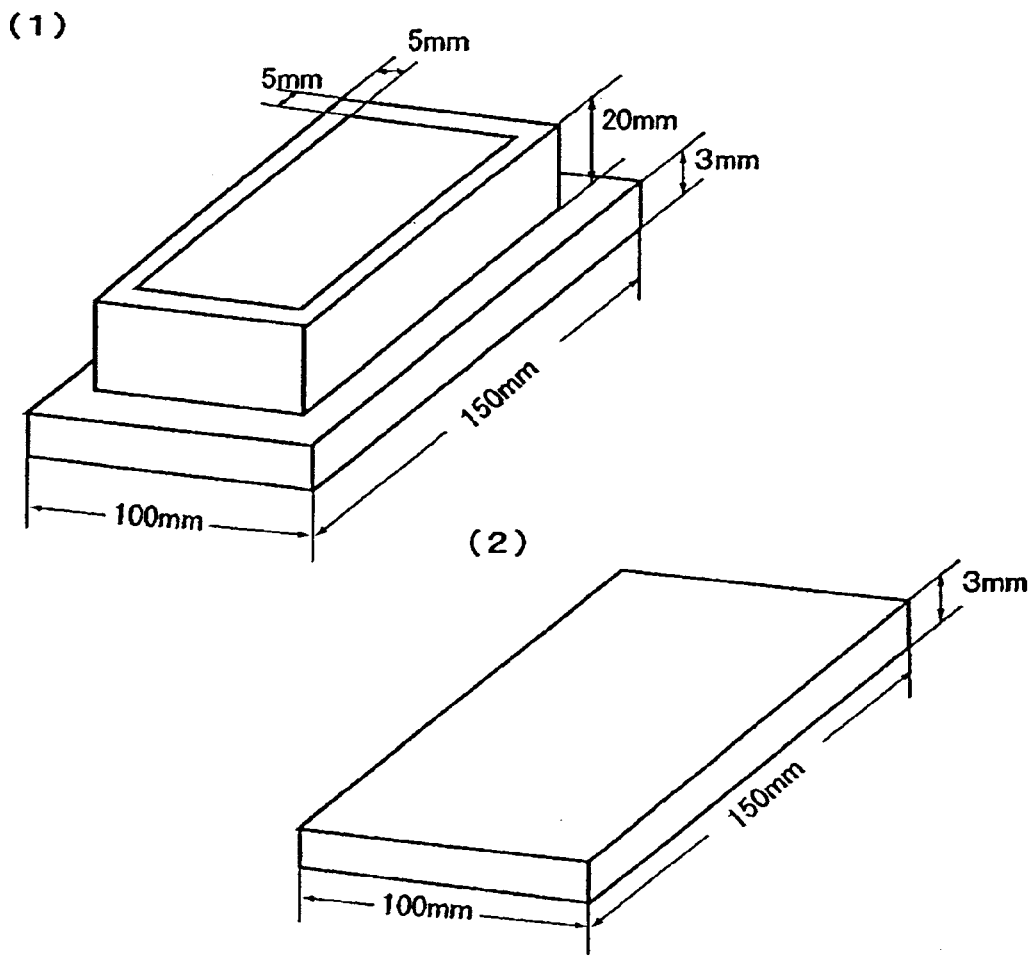
FIG. 11 is a view illustrating a housing part and a cap part used in the semiconductor device of an embodiment of the present invention.

If required, a porous body comprising the first constituent may be placed in a pressurizing container to pressure-infiltrate with the molten second constituent. In the infiltration process, in order to prevent a many-faceted exudation of the second constituent, a pre-determined face of the porous body comprising the first constituent may be protected by the pre-formation of a thin ceramic film (an exudation-preventing layer) that has no wettability with the molten second constituent. Thus, an infiltrated body free from exudation at the formed face can be obtained. For example, when an infiltrated body with a complicated shape as shown in FIG. 9 or 11 is produced, the formation of this protective layer at the faces other than the bottom face having a size of 100×150 mm can prevent the exudation of the second constituent at the fin- or box-shaped portion. This reduces the time and effort considerably for removing the exudates. After the removal of the organic binder by heating, the formed body may be pre-sintered in a non-oxidative atmosphere usually at a temperature from 1,000 to 1,800° C. or so before the infiltration in order to adjust the porosity or to facilitate the handling.

Figure 7:
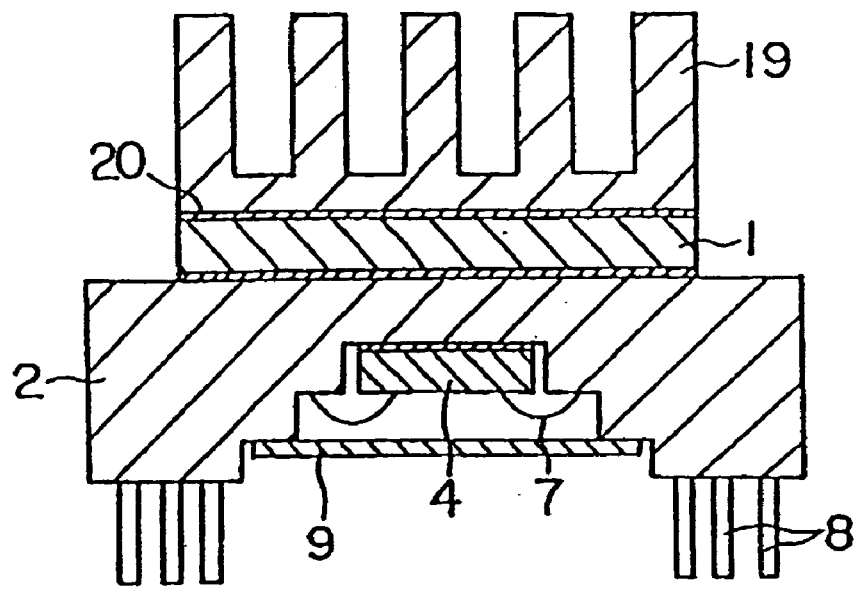
FIG. 7 is a view showing yet another example of the semiconductor device of the present invention.
Figure 8:
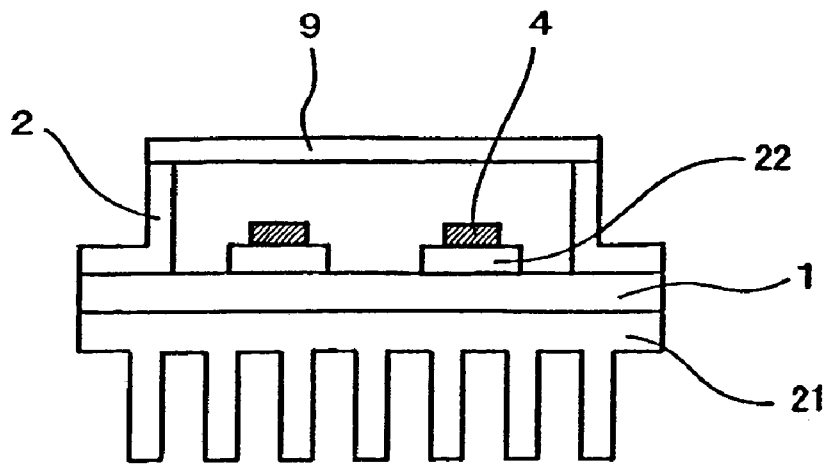
FIG. 8 is a view showing yet another example of the semiconductor device of the present invention.

The composite material of the present invention has a CTE as small as $6\times10^{-6}/°$ C. Consequently, when a member comprising the composite material of the present invention is bonded with an Si semiconductor element or with a semiconductor device's member having a small CTE, such as ceramic, W, or Mo, a heat design can easily be performed with unprecedentedly high reliability. FIGS. 1 to 7 show examples of structures of semiconductor devices (known as ceramic packages) comprising ceramic members and a ceramic heat-dissipating substrate. The composite material of the present invention is suitable for members of these devices. The principal members in the figures are a heat-dissipating substrate 1, a package body 2 (also called an enclosing material) consisting mainly of ceramic, a semi-conductor element 4, and bonding layer 5. In the ceramic packages shown in FIGS. 1 and 7, the semiconductor element 4 placed at one side of the package body 2 and the heat-dissipating substrate 1 placed at the other side of the package body 2 are bonded directly to the package body 2 with the individual bonding layer. In the ceramic packages shown in FIGS. 2 to 6, the semiconductor element 4 is bonded directly to the heat-dissipating substrate 1 with the bonding layer 5. FIG. 8 is a schematic illustration showing an example of a semiconductor device for a power module for which device the composite material of the present invention is especially useful. In FIG. 8, first substrates 22 mounting semiconductor elements 4 are placed in two rows and three columns, for example, although they are not clearly shown. Input/output leads for the semiconductor elements are omitted in FIG. 8. In FIGS. 1 to 8, the other members are a die-attaching portion 6, bonding wires 7, metallic lead pins 8, a cap 9, solder balls 10, polyimide tape 11, copper-foil circuits 12, a support ring 13, a wiring substrate 14, resin 15, a lead flame 16, insulating films 17, mold resin 18, an aluminum fin 19, silicone resin 20, a radiator 21, and first substrates 22 placed on the second heat-dissipating substrate 1.

In these packages, when the composite material of the present invention is used as a heat-dissipating substrate or a package body, the production design for the bonding layer between the composite material and another member is extremely simple. For example, as shown in FIGS. 1 and 7, when an electrically insulating ceramic is placed between a semiconductor element and a heat-dissipating substrate as a basic structure, the use of the composite material of the present invention as a heat-dissipating substrate 1 and the concurrent use of an alumina ceramic as a package body 2 reduce the difference in CTE at the two bonding interfaces through which the heat flux generated by the semiconductor element must flow. Consequently, a conventional bonding layer, such as a laminated layer comprising several different materials or a thick layer intending to reduce the thermal stress, can be switched to a single layer or a thin layer. The same can be applied to the packages shown in FIGS. 2 to 6, where a semiconductor element is bonded directly to a heat-dissipating substrate with a bonding layer.

FIG. 8 shows a power-module structure that is especially large in size among the foregoing devices and that has a heavy electrical and thermal load when operated. The structure of this power module is described in the following:

(a) a radiator 21 is placed at the bottom;

(b) a first substrate 22 made of an electrically insulating ceramic is bonded to a second heat-dissipating substrate 1 with a bonding layer (a brazing-material layer);

(c) a copper- or aluminum-foil circuit 12, not shown in FIG. 8, is bonded to the first substrate 22 with another bonding layer (one of the various types of metallized layers, a brazing-material layer, a copper-copper oxide eutectic layer, etc.); and (d) a semiconductor element 4 is connected to the circuit with yet another bonding layer (usually a soft-solder layer).

In this structure, for example, when the substrate 1 on the radiator is switched from the conventional copper plate to the composite material of the present invention and when the first substrate 22 is composed of an AlN ceramic, almost no heat stress is applied between the two substrates at the time of mounting and operation. As a result, the bonding layer between the two substrates can have a thickness as thin as 100 $\mu$m or less, especially as unprecedentedly thin as 50 $\mu$m or less. Furthermore, because the composite material of the present invention can easily produce a product having a complicated shape, all the members, such as the undermost radiator, the package body fixed on the heat-dissipating substrate, and the cap placed over the package body, can be formed as a unitary structure. On the other hand, when the radiator, heat-dissipating substrate, second heat-dissipating substrate, case, cap, etc, are separately produced by using the composite material of the present invention and assembled by bonding one another, the bonding portions can have a thickness as thin as 100 $\mu$m or less, or as extremely thin as 50 $\mu$m or less.

EXAMPLE 1

Samples having the first and second constituents were prepared. The first constituent composed of the ceramic shown in Table 1 was prepared for each sample. The ceramic had a purity of 99% or more, contained 500 ppm or less transition-metal elements in total as impurities (the Fe content was 50 ppm or less), and contained 1 wt % or less oxygen as an impurity. The second constituent in the form of powder or lump composed of a semi-metal, a metal, or both shown in Table 1 was prepared for each sample. The semi-metal and the metal had a purity of 99% or more and had an average particle diameter of 20 $\mu$m in the form of powder. With the second constituent, a powder was used when the material was pre-mixed, and lumps were used when the material was used as an infiltrant. A silicon (Si) powder was of an $\alpha$-crystal type and had an average particle diameter of 3 $\mu$m. A silicon carbide (SiC) powder was of a 6H-crystal type and was prepared by mixing a powder having an average particle diameter of 70 $\mu$m and a powder having an average particle diameter of 5 $\mu$m at a former-to-latter ratio of 3:1 in weight (the resultant average particle diameter was about 54 $\mu$m). A silicon nitride ($Si_3N_4$) powder was of $\beta$-crystal type and had an average particle diameter of 3 $\mu$m. In the cases of the boron (B) powder used in Samples 17 and 25, the graphite powder used in Sample 18, and the tungsten (W) powder used in Sample 26, the total volume of each powder was pre-mixed to the SiC powder used as the first constituent. In the case of the silicon (Si) powder used in Samples 5 to 9 and 12, a partial volume of each powder was pre-mixed to the SiC powder. The total volume of the Si in final composite is shown in the column "composition" of the column "infiltrated body" in Table 1. The pre-mixed partial volume is expressed by the numeral in the column "semi-metal" in Table 1. The numeral is expressed as the percentage to the total weight of the infiltrated body.

A three-weight-part paraffin binder was added to a 100-weight-part powder of the first constituent. The binder and the powder were ball-mill-mixed in ethanol. The obtained slurry was spray-dried to produce granules. The granules were formed into disks, 100 mm in diameter and 3 mm in thickness, with a dry press. The forming pressure was 686 MPa for Sample 1, 392 MPa for Sample 2, and 196 MPa for the other samples. The formed bodies were heated up to 400° C. under a vacuum of 1.33 Pa in order to remove the binder. Then, some of the formed bodies were sintered in the atmosphere and at the temperature both shown in the column "pre-sintering" of Table 1 for one hour in order to facilitate the handling and to slightly adjust the porosity as well. The other formed bodies, of which the column "pre-sintering" is blank, were not subjected to the pre-sintering.

The types of the powders used in the second constituent are shown in the column "second constituent" of Table 1. First, the powders for the second constituent consisting of a plurality of constituents were weighed at the weight ratio shown in the column "composition" of the column "infiltrated body" in Table 1. The weighed powders were dry-mixed with a V-type mixer. Then, the powder of the second constituent was roughly weighed in accordance with the volume of the pores of the corresponding porous body made of the first constituent. The powder was formed into a disk, 100 mm in diameter, with a dry press to obtain the infiltrant for the corresponding porous body. For each porous body, a coating composed of a TiN powder dispersed in ethanol was applied to the faces other than the face for contacting the infiltrant and then dried. Thus, a thin exudation-preventing layer made of a TiN powder was formed.

Each of these porous bodies was placed on the corresponding infiltrant composed of the second constituent in an infiltration furnace. The pores of the porous body were filled with the infiltrant in the atmosphere and at the temperature both shown in the column "infiltration" of Table 1. Samples 28 to 31 were prepared by placing the same formed body as Sample 9 in a pressurizing container, and pressure-infiltrated with Si by a mechanical pressure of 29 MPa in a vacuum of 0.13 Pa and at the temperature shown in Table 1. The other samples were infiltrated pressurelessly in the atmosphere and at the temperature both shown in Table 1 under atmospheric pressure. The pressureless infiltration was carried out to obtain the composition shown in the column "infiltrated body" in Table 1 by the method described below. The constituents melted at the time of the pressureless infiltration were Si for Samples 1 to 9, 19, and 24, 26, and 27, Ge for Sample 16; Al and Si for Samples 10 to 12, 20, and 21 (this group is called Group 1); Al for Samples 13, 17, 18, and 25 (this group is called Group 2); Si and Cu for Samples 14 and 22 (this group is called Group 3); and Si and Ag for Samples 15 and 23 (this group is called Group 4). Consequently, the infiltration temperature for the samples belonging to each group was determined so as to exceed the melting point of the infiltrating constituent as shown in Table 1. The infiltration temperature was maintained for 30 minutes. In the case of Samples 20 and 21 of Groups 1, 3, and 4, the infiltration temperature was maintained for 30 minutes at first at a temperature slightly higher than the melting point of Al, Cu, and Ag, respectively, and then raised to the temperature shown in Table 1.

The molten substance of the second constituent did not exude at the face where an exudation-preventing layer was formed. It exuded only at the bottom face that was in contact with the infiltrant. Almost no shrinkage, distortion, and damage were confirmed on the samples after the infiltration. After the faces free from the exudation were blast-finished, the face contaminated by the exudation of the second constituent was finished with a grinder to remove the exudate. The finished individual samples had dimensions almost equal to those intended.

Although not shown in Table 1, the same SiC formed bodies as in Sample 4 were prepared separately. With a sample called Sample 4', the binder was removed by the same method as in Sample 4, and pre-sintering was performed at 1,800° C. for one hour to obtain an SiC porous body. With another sample called Sample 4", the binder was removed similarly, and pre-sintering was performed at 2,000° C. for one hour in an argon gas at 101.3 KPa to obtain an SiC porous body. The former was infiltrated with Si at 1,800° C. in an argon gas at 1.33 Pa. The infiltrated bodies obtained as Samples 4' and 4" were both composed of 25 wt % Si and 75 wt % SiC.

All the samples including Samples 4' and 4" were evaluated by relative density, thermal conductivity, and a CTE. The relative density is a ratio of the measured density obtained by the underwater method to the theoretical density. The thermal conductivity was measured by the laser flash method. The CTE was measured by the differential transformer method using a stick-shaped specimen separately produced by the same method as used for the sample. The results are shown in Table 1.

Although not shown in Table 1, the amount of impurities, i.e., oxygen and transition-metal elements, in the infiltrated body was measured by chemical analysis. In every sample, the total amount of these impurities was 0.5 wt % or less, the amount of the transition-metal elements was 300 ppm or less in terms of the total amount of elements, and the amount of iron was 40 ppm or less in terms of elements.

The average particle diameter of the ceramic particle of the first constituent in the infiltrated body was measured. The result was 72 $\mu$m for Samples 1 to 18, 4', 4", and 26 to 31 and 3 $\mu$m for Samples 19 to 25. The average particle diameter was obtained by the following method: First, a microphotograph of a fractured section of the sample was taken under a scanning electron microscope (SEM) at 100 power. Second, two diagonal lines were drawn in the field of view. Third, the sizes of the particles intersected by the diagonal lines were read. Finally, the arithmetic mean of the sizes yielded the average particle diameter.

Samples 4' and 4" both had a relative density of 100%, a CTE of $3.85 \times 10^{-6}$/° C., and a thermal conductivity of 235 W/m·K.

Although not shown in Table 1, the main surface of every sample was plated with nickel having a thickness of 3 $\mu$m. An Si semiconductor element was bonded with the plated layer through an Ag—Sn-based soldering layer having a thickness of 90 $\mu$m. The samples were subjected to a heat cycle test in which a sample was first maintained at −60° C. for 30 minutes and then maintained at 150° C. for 30 minutes, and this cycle was repeated 1,000 times. With the assembly incorporating Sample 13 that had a large CTE, the semiconductor element began to separate in the 500th cycle. On the other hand, with the assemblies incorporating the composite material of the present invention having a CTE of $6 \times 10^{-6}$/° C. or less, the bonding between the semiconductor and the composite material was free from problems after the 1,000th cycle.

TABLE 1

| | | | | | | | | | | Infiltrated body | | |
| --- | --- | --- | --- | --- | --- | --- | --- | --- | --- | --- | --- | --- |
| | | Second constituent | | Pre-sintering | | Infiltration | | | | | Thermal | Coefficient of thermal expansion |
| Sample No. | First constituent | Semi-metal | Metal | Atmosphere | Temperature (° C.) | Atmosphere | Temperature (° C.) | Composition (Numeral: wt %) | | Relative density (%) | conductivity (W/m · K) | ($\times 10^{-6}$/° C.) |
| 1 | SiC | Si | — | Vacuum | 1,600 | Argon | 1,600 | Si 9%—SiC 91% | | 98 | 230 | 3.76 |
| 2 | SiC | Si | — | Vacuum | 1,600 | Argon | 1,600 | Si 10%—SiC 90% | | 99 | 242 | 3.75 |
| 3 | SiC | Si | — | Vacuum | 1,600 | Argon | 1,600 | Si 20%—SiC 80% | | 100 | 240 | 3.83 |
| 4 | SiC | Si | — | — | — | Argon | 1,600 | Si 25%—SiC 75% | | 100 | 233 | 3.85 |
| 5 | SiC | Si; pre 13 | — | — | — | Argon | 1,600 | Si 35%—SiC 65% | | 100 | 220 | 3.91 |
| 6 | SiC | Si; pre 20 | — | — | — | Argon | 1,600 | Si 40%—SiC 60% | | 100 | 213 | 3.94 |

TABLE 1-continued

| | | | | | | | | | | | Infiltrated body | | |
|---|---|---|---|---|---|---|---|---|---|---|---|---|---|
| | | Second constituent | | Pre-sintering | | Infiltration | | | | | | Thermal | Coefficient of thermal |
| | First | | | | Temperature | | Temperature | | | | Relative density | conductivity | expansion |
| Sample No. | constituent | Semimetal | Metal | Atmosphere | (° C.) | Atmosphere | (° C.) | Composition (Numeral: wt %) | | | (%) | (W/m · K) | (× 10⁻⁶/ ° C.) |
| 7 | SiC | Si; pre 45 | — | — | — | Argon | 1,600 | Si 60%—SiC 40% | | | 100 | 190 | 4.03 |
| 8 | SiC | Si; pre 60 | — | — | — | Argon | 1,600 | Si 70%—SiC 30% | | | 100 | 179 | 3.93 |
| 9 | SiC | Si; pre 70 | — | — | — | Argon | 1,600 | Si 80%—SiC 20% | | | 100 | 169 | 4.12 |
| 10 | SiC | Si | Al | Vacuum | 1,550 | Argon | 1,560 | Si 10%—SiC 80%—Al 10% | | | 100 | 251 | 6.00 |
| 11 | SiC | Si | Al | — | — | Argon | 1,560 | Si 20%—SiC 72%—Al 8% | | | 100 | 237 | 5.58 |
| 12 | SiC | Si; pre | Al | — | — | Argon | 1,560 | Si 20%—SiC 72%—Al 8% | | | 100 | 218 | 5.61 |
| *13 | SiC | — | Al | — | — | Argon | 700 | SiC 70%—Al 30% | | | 100 | 260 | 10.60 |
| *14 | SiC | — | Cu | Vacuum | 1,600 | Argon | 1,200 | SiC 80%—Cu 20% | | | 100 | 282 | 4.72 |
| 15 | SiC | Si | Ag | — | — | Argon | 1,560 | Si 20%—SiC 60%—Al 20% | | | 100 | 247 | 4.90 |
| 16 | SiC | Ge | — | Vacuum | 1,530 | Argon | 1,000 | Ge 25%—SiC 75% | | | 100 | 235 | 4.06 |
| 17 | SiC | B; pre | Al | Vacuum | 1,540 | Argon | 700 | B 5%—SiC 87%—Al 8% | | | 98 | 260 | 5.82 |
| 18 | SiC | Gr; pre | Al | Vacuum | 1,550 | Argon | 700 | Gr 5%—SiC 87%—Al 8% | | | 98 | 250 | 5.57 |
| 19 | AlN | Si | — | Nitrogen | 1,540 | Argon | 1,600 | Si 25%—AlN 75% | | | 100 | 164 | 4.41 |
| 20 | AlN | Si | Al | Nitrogen | 1,550 | Argon | 1,600 | Si 25%—AlN 70%—Al 5% | | | 100 | 231 | 5.48 |
| 21 | Si₃N₄ | Si | Al | — | — | Nitrogen | 1,560 | Si 45%—Si₃N₄ 43%—Al 12% | | | 100 | 150 | 6.00 |
| 22 | Si₃N₄ | Si | Cu | — | — | Nitrogen | 1,560 | Si 40%—Si₃N₄ 40%—Cu 20% | | | 100 | 157 | 4.59 |
| 23 | Si₃N₄ | Si | Ag | — | — | Nitrogen | 1,560 | Si 45%—Si₃N₄ 40%—Ag 15% | | | 100 | 151 | 4.42 |
| 24 | BN | Si | — | — | — | Nitrogen | 1,600 | Si 30%—BN 70% | | | 100 | 570 | 3.60 |
| 25 | BN | B; pre | Al | — | — | Nitrogen | 700 | B 5%—BN 85%—Al 10% | | | 100 | 553 | 5.54 |
| 26 | SiC | Si | W; pre | — | — | Argon | 1,600 | Si 20%—SiC 70%—W 10% | | | 100 | 233 | 3.83 |
| 27 | SiC | Si | Mn | Argon | — | Argon | 1,600 | Si 25%—SiC 70%—Mn 5% | | | 100 | 233 | 4.75 |
| 28 | SiC | Si | — | Argon | 1,600 | Vacuum | 1,600 | Si 20%—SiC 80% | | | 100 | 240 | 3.83 |
| 29 | SiC | Si | — | Vacuum | 1,800 | Vacuum | 1,600 | Si 25%—SiC 75% | | | 100 | 233 | 3.85 |
| 30 | SiC | Si | — | Argon | 1,600 | Vacuum | 1,800 | Si 20%—SiC 80% | | | 100 | 240 | 3.83 |
| 31 | SiC | Si | — | Vacuum | 1,800 | Vacuum | 1,800 | Si 25%—SiC 75% | | | 100 | 233 | 3.85 |

Note:
*Comparative Example; the term "pre" in the column "second constituent" shows that the constituent is pre-mixed in the first constituent; the term "Gr" for Sample 18 represents graphite; and in the column "atmosphere", the "vacuum" has a pressure of 10⁻³ torr, and the "nitrogen" and "argon" have a pressure of 1 atm.

The obtained results can be interpreted as follows:

1) In the case of a porous body of the first constituent consisting mainly of ceramic, such as SiC having a CTE of $5 \times 10^{-6}/°$ C. or less, when the volume of the pores is adjusted and when the pores are filled either with a semi-metal having a CTE of $8.5 \times 10^{-6}/°$ C. or less or with a mixture of the foregoing semi-metal and a metal having a thermal conductivity of 140 W/m·K or more, a composite material that combines a CTE as small as $6 \times 10^{-6}/°$ C. or less and a thermal conductivity as high as 150 W/m·K or more can be obtained.

(2) When the ceramic consists of SiC and the semi-metal consists of Si, a composite material having a CTE of 5 ppm/° C. or less can be obtained within a wide range of the amounts of these constituents. In particular, when the amount of SiC is 50 wt % or more, a composite material having a thermal conductivity as high as 200 W/m·K or more can be obtained.

(3) In the case of an Al—SiC—Si-based composition, when the amount of Al is 10 wt % or less, a composite material having a CTE of $6 \times 10^{-6}/°$ C. or less can be obtained.

(4) In the case of an assembly in which an Si semiconductor element is bonded directly to the composite material of the present invention having a CTE of $6 \times 10^{-6}/°$ C. or less, even when the element is bonded through an unprecedentedly thin layer of solder, the bonded portion has sufficiently high reliability. Therefore, a substrate made of the composite material of the present invention can offer a highly reliable semiconductor-device assembly in which an Si semiconductor element is bonded directly to the substrate.

(5) A formed body of a powder consisting mainly of the first constituent and the porous body obtained by sintering the formed body exhibit almost no shrinkage after the infiltration with the second constituent. Consequently, the infiltration process yields a net-shape composite material, except the face at which the second constituent exudes.

EXAMPLE 2

SiC powders having varying average particle diameters and amounts of impurities shown in Table 2 were prepared, and the same Si powders as used in Example 1 were prepared. Disk-shaped formed bodies having the same size as in Example 1 were produced by a method similar to that in Example 1. The formed bodies were heated at 400° C. in a vacuum of 1.33 Pa to remove the binder and then heated up to 1,800° C. in the same vacuum and maintained at 1,800° C. for one hour. Next, the formed bodies were maintained at 1,600° C. in a vacuum of 1.33 Pa to obtain composite materials consisting mainly of 25 wt % Si and 75 wt % SiC.

The samples were subjected to the same evaluation as in Example 1. The results are shown in Table 2.

TABLE 2

| | SiC powder | | | | Infiltrated body | | | | | |
|---|---|---|---|---|---|---|---|---|---|---|
| | | | Amount of impurities | | | | | | Amount of impurities | |
| Sample No. | Average particle diameter (μm) | Total amount (wt %) | Total amount of transition-metal elements (ppm) | Total amount of iron-group-metal elements (ppm) | Relative density (%) | Thermal conductivity (W/m · K) | Coefficient of thermal expansion (× 10⁻⁶/° C.) | Average particle diameter of SiC (μm) | Total amount (wt %) | Total amount of transition-metal elements (ppm) | Total amount of iron-group-metal elements (ppm) |
| 1 | 54 | 1.3 | 350 | 80 | 100 | 235 | 3.85 | 72 | 0.5 | 280 | 60 |
| 2 | 22 | 1.9 | 540 | 190 | 100 | 198 | 3.85 | 28 | 1.1 | 510 | 150 |
| 3 | 25 | 1.7 | 520 | 170 | 100 | 201 | 3.85 | 32 | 1.1 | 510 | 150 |
| 4 | 54 | 1.8 | 530 | 190 | 100 | 208 | 3.85 | 72 | 1.1 | 500 | 160 |
| 5 | 22 | 2.2 | 540 | 190 | 100 | 203 | 3.85 | 28 | 0.9 | 510 | 150 |
| 6 | 22 | 1.4 | 530 | 180 | 100 | 209 | 3.85 | 28 | 0.5 | 510 | 150 |
| 7 | 54 | 1.3 | 510 | 170 | 100 | 214 | 3.85 | 72 | 0.5 | 510 | 150 |
| 8 | 22 | 1.9 | 500 | 180 | 100 | 202 | 3.85 | 28 | 1.1 | 490 | 150 |
| 9 | 22 | 1.9 | 370 | 170 | 100 | 208 | 3.85 | 28 | 1.1 | 300 | 150 |
| 10 | 54 | 1.2 | 340 | 170 | 100 | 225 | 3.85 | 72 | 0.5 | 300 | 150 |
| 11 | 22 | 1.9 | 540 | 120 | 100 | 203 | 3.85 | 28 | 1.1 | 510 | 100 |
| 12 | 22 | 1.9 | 540 | 80 | 100 | 209 | 3.85 | 28 | 1.1 | 510 | 60 |

The results obtained for the SiC—Si-based composite materials can be interpreted as follows:

(1) The reduction in the amount of impurities down to 1 wt % or less yields a composite material having a thermal conductivity as high as over 200 W/m·K.

(2) The reduction in the amount of transition-metal elements down to 1,000 ppm or less, especially the amount of iron-group elements down to 100 ppm or less, yields a composite material having higher thermal conductivity.

Additionally, composite materials having the same composition as in Example 1's Sample 19, which has AlN as the first constituent, and composite materials having the same composition as in Example 1's Sample 21, which has $Si_3N_4$ as the first constituent, were produced with varying amounts of impurities in the powder of the first constituent. The obtained evaluation results showed that the effects of the total amount of impurities and the amount of transition-metal-element impurities have a tendency similar to that in the foregoing SiC—Si-based composition.

EXAMPLE 3

Figure 10:
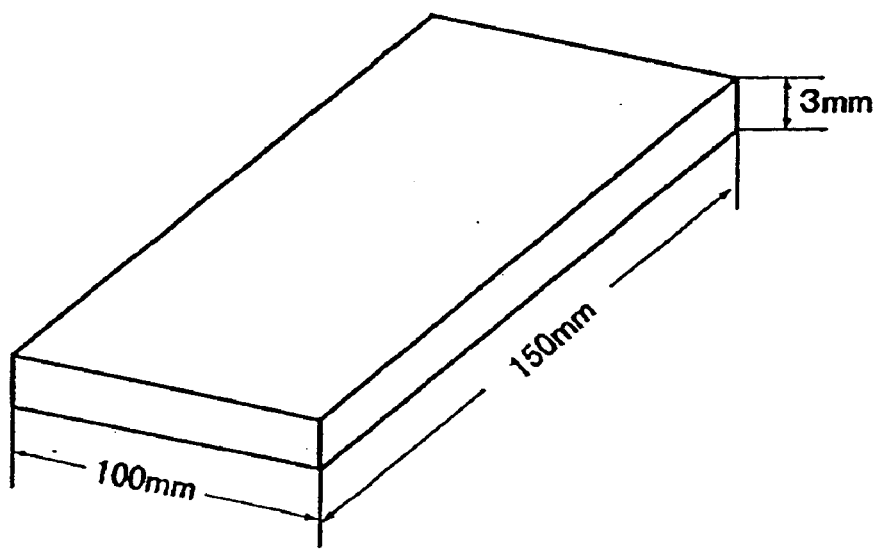
FIG. 10 is a view illustrating a heat-dissipating substrate used in the semiconductor device of an embodiment of the present invention.

Fin-shaped members as radiators shown in FIG. 9, plate-shaped members as heat-dissipating substrates shown in FIG. 10, container-shaped members as housings shown in FIG. 11, and lid-shaped members as caps shown in FIG. 11 were produced as members of power modules by using composite materials having the same compositions as in Samples 2 to 6, 11, 13, 20, 22, 25, 28, and 29 in Table 1. The member shown in FIG. 9 corresponds to the radiator 21 in FIG. 8, the member shown in FIG. 10 corresponds to the base-plate portion 1 in FIG. 8, and FIG. 11 corresponds to the housing portion and the cap portion in FIG. 8. The fin-shaped member shown in FIG. 9 was produced through the following process: First, an aqueous solvent was added to granules prepared by the same method as in Example 1 to obtain slurry. Second, the slurry was poured into a gypsum mold and dries for three days. Third, the dried body was removed from the mold and processed with a dry milling cutter to obtain the final shape of the formed body. The formed body of the housing-shaped member shown in FIG. 11 (1) was produced through the following process: First, granules of the first constituent prepared by the same method as in Example 1 were charged into a rubber mold to carry out isostatic molding. Second, the binder was removed under the same condition as in Example 1. Third, the formed body was machined with a dry milling cutter to obtain a shape similar to the final shape. The plate-shaped formed bodies shown in FIGS. 10 and 11 (2) were produced through the following process: First, a cellulose binder and water were added to a powder of the first constituent to be mixed and kneaded by a kneader. The kneaded body was formed to a shape of a sheet with an extruder. The sheet was cut at a specified length, and the binder was removed under the same condition as in Example 1.

Every obtained formed body was sintered at a pre-sintering temperature corresponding to the composition shown in Table 1 to obtain a porous body. Every porous body was placed on a board of infiltrant separately prepared by a procedure similar to that in Example 1 and placed in an infiltration furnace. With every shaped body, the board of infiltrant was placed under the porous body having one of the shapes shown in FIGS. 9 to 11 so as to be in contact with the entire bottom face of the porous body. The porous body was infiltrated with the second constituent under the same condition as used in the sample that has a corresponding composition in Example 1. As with Example 1, an exudation-preventing layer was formed in advance on every face except the bottom face of the sintered body.

Each formed body having the composition corresponding to that of Sample 28 or 29 was placed in a pressure vessel suitable to the shape of the member. Then, the infiltration with molten Si was carried out by a method similar to that in Example 1.

Every sample after the infiltration was free from deformation or damage and had a shape close to the intended one. The finishing of the faces other than the bottom face, at which the second constituent exuded, and the burring at every corner were carried out with a blasting machine. The bottom face was finished with a surface grinding machine so as to become parallel with the opposite face. Comparisons of the ease (speed) of finishing by grinding were performed between the Si—SiC-based composition (hereinafter called "A" group, which corresponds to Samples 2 to 6), the Al—SiC—Si-based composition (hereinafter called "B" group, which corresponds to Sample 11), and the Al—SiC-based composition (hereinafter called "C" group, which corresponds to Sample 13). "A" group, which contains no Al, was far superior to the other two groups. "B" and "C" groups followed "A" group in this order. The cut specimens from these samples were used to evaluate relative density, thermal conductivity, and CTEs as in Example 1. The results confirmed that those samples had property levels comparable to those of the corresponding samples in Table 1.

EXAMPLE 4

Of the members of the present invention produced in Example 2, various members having the compositions corresponding to Samples 4, 11, 13, 20, and 30 in Table 1 were prepared. These members were assembled to produce power modules having the basic structure shown in FIG. 8. The power modules were subjected to a heat-cycle test under the same condition as in Example 1 (a heat cycle consisting of cooling at −60° C. for 30 minutes and heating at 150° C. for 30 minutes is repeated 1,000 times). The test was carried out with a radiator having the shape shown in FIG. 9 being cooled by water from the outside. The combinations for the assembly into a module and the evaluation items are shown in Table 3. Thirty modules each were prepared for every sample.

As shown in the column "assembled member" in the same table, the shapes of the members are classified as "FIG. 9; Fin", "FIG. 10; Substrate", "FIG. 11; Container", and "FIG. 11; Lid". The numerals in this column represent the classification of the material used for individual members. For example, "4" for Sample 32 indicates the corresponding sample number in Table 1, showing that the member was made of the same material as used in the indicated sample. With Samples 32 to 35, the individual members were separately produced using the same materials and then assembled. With Samples 36 to 38, only the fin-shaped radiator denoted by "Al" was produced using aluminum (the exposing surfaces after the assembly were anodized); the remaining three members were separately produced using the indicated material; and then they were assembled. With Sample 39, the members shown in FIGS. 9 and 10 and the container part shown in FIG. 11 were produced using the same material as used in Sample 11 as a unitary structure and then assembled with a lid made of the same material. With Sample 40, the members shown in FIGS. 9 and 10 were produced as a unitary structure, and the members shown in FIG. 11 were produced as a unitary structure. With Samples 41 and 42, the member shown in FIG. 10 and the container part shown in FIG. 11 were produced as a unitary structure. The members produced as a unitary structure were produced by the same method that produced the fin-shaped member in Example 2.

TABLE 3

| | Assembled member (Numeral: corresponding Sample No.) | | | | Endurance quality and output performance | | | | |
|---|---|---|---|---|---|---|---|---|---|
| | | | | | | Damage at bonding portion | | | |
| Sample No. | FIG. 9 Fin | FIG. 10 Substrate | FIG. 11 Container | Lid | Damage in member | Between substrates | Between substrate and container | Between container and lid | Reduction in output of module |
| 32 | 4 | 4 | 4 | 4 | None | None | None | None | None |
| 33 | 11 | 11 | 11 | 11 | None | None | None | None | None |
| *34 | 13 | 13 | 13 | 13 | Cracks in first substrate | None | None | None | A little reduction |
| 35 | 20 | 30 | 30 | 30 | None | None | None | None | None |
| 36 | Al | 4 | 4 | 4 | None | None | None | None | None |
| 37 | Al | 11 | 11 | 11 | None | None | None | None | None |
| *38 | Al | 13 | 13 | 13 | Cracks in first substrate | None | None | None | A little reduction |
| 39 | 11; unitary structure | | | 11 | None | None | — | None | None |
| 40 | 11; unitary structure | | 11; unitary structure | | None | None | None | — | None |
| 41 | Al | 11; unitary structure | | 11 | None | None | None | None | None |
| 42 | Al | 30; unitary structure | | 11 | None | None | None | None | None |
| 43 | 30; unitary structure | | 11; unitary structure | | None | None | None | None | None |
| 44 | 30; unitary structure | | | 11 | None | None | None | None | None |

Note:
the sign * represents Comparative Example.

The first substrate (corresponding to the member 22 in FIG. 8) to be mounted on the second substrate shown in FIG. 10 was produced by using the same ceramic material for every sample. The first substrate had a width of 30 mm, a length (in the depth direction in FIG. 8) of 40 mm, and a thickness of 1 mm, and was composed of an aluminum nitride ceramic having a thermal conductivity of 180 W/m·K and a CTE of $4.5 \times 10^{-6}$/° C. A copper-foil circuit having a thickness of 0.3 mm was formed on the substrate through an intervening metal layer. An Si semiconductor element was then bonded to the circuit with Ag—Sn-based solder.

Prior to the assembly, an electroless nickel-plated layer having an average thickness of 5 $\mu$m and an electrolytic nickel-plated layer having an average thickness of 3 $\mu$m were formed on the main surface of the second substrate. Four specimens each were drawn from every sample after the foregoing nickel plating. These specimens were subjected to the following bonding test: A copper wire having a diameter of 1 mm was attached perpendicularly to the nickel-plated surface with a hemisphere, 5 mm in diameter, of Ag—Sn-based solder. With the main body of the substrate being fixed to a mounting tool, the copper wire was pulled in the direction perpendicular to the plated surface in order to confirm the bonding strength between the plated layer and the substrate. The test results proved that there was no specimen showing separation between the plated layer and the substrate at a tensile force of 1 kg/mm² or more. Ten other specimens of nickel-plated substrates each drawn from every sample were subjected to a heat cycle test under the same condition as previously described. After the heat cycle test, the same bonding test as above was carried out. Every specimen satisfactorily met the above-mentioned level of bonding strength of the plated layer. These test results demonstrated that the composite materials of the present invention and Sample 13 have a sufficient level of bonding strength between the plated layer and the composite material in practical application.

Next, the foregoing first substrates on which only the copper-foil circuit was formed were set on the main surface of the nickel-plated second substrate in two rows and three columns at equal intervals and fixed with a layer, 80 μm in thickness, of Al—Sn-based solder. As described above, a semiconductor element was mounted on every substrate. A connecting part was provided on every substrate to connect the semiconductor element with outer circuits. Finally, all the components were assembled to form the power-module structure shown in FIG. 8. The assembly work was performed by threading bolts through the fixing holes passing through the plate, 100 mm in width and 150 mm in length, of every member shown in FIGS. 9, 10, and 11 (1). The fixing holes were provided at the four corners of the plate. The fixing holes for the member made of Aluminum were drilled with an end mill. The fixing holes for the member made of the composite material were provided by enlarging the prepared holes, previously provided at the initial stage, to a diameter of 3 mm by the irradiation of laser beams from a carbon dioxide laser. The laser processing was conducted with high precision and high speed in comparison with other objects such as ceramic materials, Cu—W-based composite materials, and Cu—Mo-based composite materials. This tendency became particularly noticeable as the thermal conductivity increased. Before the assembly, a silicone-oil compound was applied on the bottom face of the second substrate and on the connecting surface of the fin-shaped member for cooling. The container and the lid shown in FIG. 11, plated with nickel on their bonding faces, were mutually bonded in advance with a material, 90 μm in thickness, of Ag—Cu-based silver solder.

Fifteen specimens each taken from every sample were subjected to a heat cycle test under the foregoing condition as an endurance test. After the test, appearance abnormalities in the members and output changes in the modules were examined. The results are shown in Table 33. The sign "−" in the table shows that the item is not applicable because the test subject has a unitary structure. The result "none" in the table shows that the test result showed no abnormality after the 1,000th heat cycle. As can be seen from the test results shown in Table 33, in the case of Comparative Samples 34 and 38, minute cracks were observed on the ceramic substrate in the vicinity of the bonding portion between the first substrate and the second substrate. The minute cracks reduced the heat-dissipating performance, raising the temperature of the semiconductor element. As a result, the output of the module reduced slightly after the test. On the other hand, the samples of the present invention exhibited no damage or no reduction in output after the test.

The test results described above demonstrated that the power module incorporating the members composed of the composite material of the present invention has a satisfactory level of performance in practical application. Additionally, various devices shown in FIGS. 1 to 7 were assembled in which a heat-dissipating substrate 1, a package body 2, or both were produced by using the composite material of the present invention or a ceramic made of the same material as used in the above-described test. These devices were subjected to the same heat cycle test as described above. No damage was observed at the bonding portion between the members made of the composite material of the present invention, at the bonding portion between the member made of the composite material of the present invention and the member made of a material other than the composite material of the present invention, or at every one of the members. No reduction in the output of the devices was also confirmed. These test results demonstrated that these devices have satisfactory performance for practical application.

EXAMPLE 5

Figure 12:
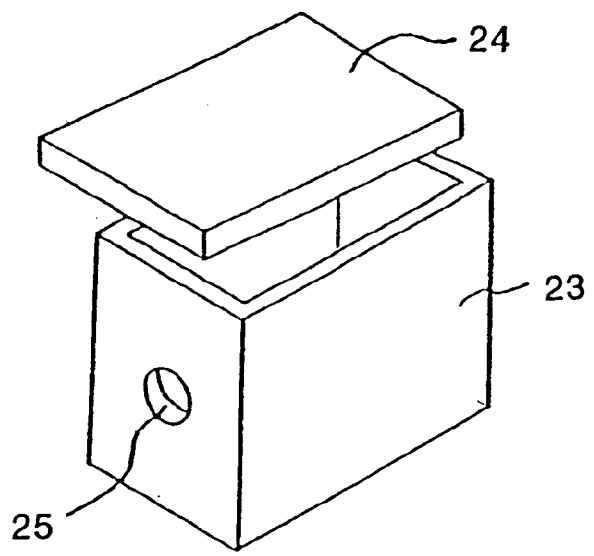
FIG. 12 is a view illustrating a case part and a lid part used in the semiconductor device of another embodiment of the present invention.

Packages for microwave integrated circuits, which packages comprise a case 23 and a lid 24 shown in FIG. 12, were produced by using the same composite materials as Samples 2 to 6, 11, 13, 20, 22, 25, 28, and 29 in Example 1. The formed body for the case was produced by the same procedure as explained in Example 3 for producing the member shown in FIG. 11 (1). The formed body for the lid was produced by the following process: First, a cellulose-family binder was added to a powder of the first constituent. Second, the binder and powder were processed with a kneader. Third, the kneaded body was extruded to obtain a form of sheet, and cut. The formed bodies obtained were subjected to the pre-sintering and the infiltration by the procedure corresponding to individual samples shown in the table in Example 1. The case 23 was provided with a hole 25 for a lead terminal or for fixing an optical fiber. The case houses an Si semiconductor element for a microwave integrated circuit, a photoelectric transfer circuit, or a light-amplifying circuit and the substrate for the element.

In this case, an Al—Si-based or Al—SiC-based composite material cannot be bonded with another material with a soldering material having a melting point higher than that of Al. Consequently, with housings made of these composite materials, the assembly work is carried out by using low-temperature solder. On the other hand, the composite material of the present invention allows the use of a high-temperature brazing material, thereby significantly reducing the dielectric loss in practical application.

As distinguished from a member made of an Al—Si-based or Al—SiC-based composite material, in which Si or SiC is dispersed in the Al matrix, a member made of the composite material of the present invention has practically no difference in CTE between the member and the foregoing circuit having an Si semiconductor element. As a result, the present invention can offer a package having unprecedentedly high reliability. Specimens were prepared in which microwave integrated circuits having Si semiconductor elements were housed in cases produced by the foregoing method. The specimens were subjected to a heat-resistance test in which they were maintained at 200° C. for 15 minutes and to a heat cycle test in which they were first maintained at −60° C. for 30 minutes and then maintained at 150° C. for 30 minutes, and this cycle was repeated 1,000 times. After each test, every bonding portion of the packages maintained an air tightness as high as about $1 \times 10^{-10}$ cc/sec in the leak rate in a helium leak test. No abnormality for practical use was also observed in the output performance of the circuits.

INDUSTRIAL APPLICABILITY

As described above in detail, the composite material of the present invention has a CTE as low as $6 \times 10^{-6}/°$ C. or less, which is extremely close to that of an Si semiconductor element. It also has excellent thermal conductivity in comparison with other composite materials of this type represented by the conventional Si—SiC-based material and Si—SiC—Al-based material. Of the composite materials of the present invention, in particular, a composite material containing 50 wt % or more Si not only has a thermal conductivity as high as 200 W/m·K or more but also has a CTE that is almost the same as that of an Si semiconductor element. Consequently, the composite material of the present invention is useful not only for a heat-dissipating substrate of semiconductor devices but also for other various members of semiconductor devices. In particular, the composite material has extremely high reliability at the bonding portion between the composite material and a semiconductor element and between the composite material and a ceramic member. The composite material also offers easy obtainability of net-shape materials and reduces the production cost because of its easy machinability. In particular, it enables the low-cost production of products having complicated shapes. As a result, an assembly that has so far been produced by bonding various members can be produced as a unitary structure.

What is claimed is:

1. A composite material having:
   (a) a structure comprising:
      (a1) a three dimensional network structure comprising ceramic, the structure including interstices; and
      (a2) a semi-metal-containing constituent produced by deposition after melting, the constituent filling the interstices;
   (b) a coefficient of thermal expansion of $6 \times 10^{-6}/°$ C. or less; and
   (c) a thermal conductivity of 150 W/m·K or more,
      wherein a predominate constituent of said semi-metal-containing constituent is a semi-metal.

2. The composite material as defined in claim 1, wherein the ceramic has an average particle diameter of 30 $\mu$m or more.

3. A composite material as defined in claim 1, wherein the ceramic contains silicon carbide.

4. The composite material as defined in claim 3, wherein the amount of silicon carbide is 50 wt % or more.

5. A composite material as defined in claim 1, wherein the semi-metal is silicon.

6. A composite material as defined in claim 1, wherein the total amount of impurities in the composite material is 1 wt % or less.

7. The composite material as defined in claim 6, wherein the total amount of transition-metal impurities is 1,000 ppm or less in terms of the elements of the impurities.

8. The composite material as defined in claim 7, wherein the total amount of iron-group-metal impurities is 100 ppm or less in terms of the elements of the impurities.

9. A composite material as defined in claim 1, the composite material having a thermal conductivity of 200 W/m·K or more.

10. A member for semiconductor devices, the member comprising a composite material as defined in claim 1.

11. A semiconductor device comprising the member as defined in claim 10.

12. A composite material according to claim 1, wherein said semi-metal-containing constituent comprises a metal additive in an amount 20 wt % or less of the total weight of the composite material.

* * * * *

UNITED STATES PATENT AND TRADEMARK OFFICE
CERTIFICATE OF CORRECTION

PATENT NO. : 6,737,168 B1  Page 1 of 1
DATED : May 18, 2004
INVENTOR(S) : Shinichi Yamagata et al.

It is certified that error appears in the above-identified patent and that said Letters Patent is hereby corrected as shown below:

Drawings,
Sheet 5 of 5, Fig. 11 (1), replace the currently printed figure with the following
Fig. 11 (1)

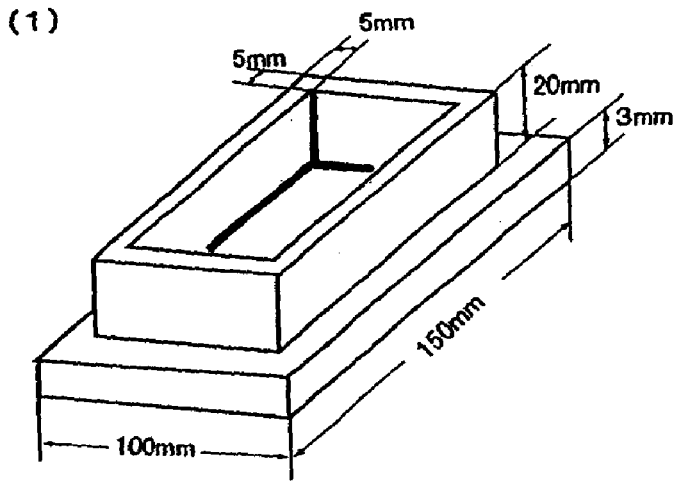

Signed and Sealed this

Fifth Day of April, 2005

JON W. DUDAS
*Director of the United States Patent and Trademark Office*